United States Patent [19]

Blackburn et al.

[11] 4,048,576
[45] Sept. 13, 1977

[54] TRANSISTOR AMPLIFIER STAGE WITH SELECTIVELY ADJUSTABLE GAIN CONTROL CIRCUIT

[75] Inventors: Tom L. Blackburn, San Jose; Otto G. Wisotzky, San Francisco, both of Calif.

[73] Assignee: GTE Automatic Electric Laboratories Incorporated, Northlake, Ill.

[21] Appl. No.: 636,018

[22] Filed: Nov. 28, 1975

[51] Int. Cl.² ........................................... H03G 3/30
[52] U.S. Cl. ..................................... 330/29; 330/86; 330/145; 333/81 R
[58] Field of Search .................. 330/29, 51, 86, 145; 333/81 R

[56] References Cited

U.S. PATENT DOCUMENTS

| | | | |
|---|---|---|---|
| 3,032,704 | 5/1962 | Beck | 330/29 X |
| 3,124,760 | 3/1964 | Dijkstra | 330/29 |
| 3,531,731 | 9/1970 | Matsuura et al. | 330/86 X |
| 3,760,287 | 9/1973 | Harris | 330/51 X |
| 3,898,593 | 8/1975 | Oureshi | 333/81 R |

OTHER PUBLICATIONS

Tobey, "Vary Op-Amp Gain by 2040:1 in Steps of 2:1", *Electronic Design* 24, Nov. 22, 1970, p. 60.

*Primary Examiner*—James B. Mullins
*Attorney, Agent, or Firm*—Russell A. Cannon; Leonard R. Cool

[57] ABSTRACT

Gain control circuits in the base and emitter circuits of a common-emitter transistor amplifier stage each include pluralities of resistors and electrically conductive screw-type switches which are connected together such that the net changes in decibel values of gain provided by closing individual switches are cumulative. Resistors in the emitter gain control circuit are electrically connected in parallel with the emitter resistor in the AC equivalent of the amplifier in various configurations by closing screw switches to decrease the effective emitter resistance and thereby increase the decibel value of amplifier gain in steps of prescribed magnitudes. The switches are selectively closed in a prescribed manner to provide step changes in the decibel value of the net gain of the stage in discrete consecutive steps of the same magnitude. Transistor amplifiers with emitter gain control circuits may be connected in series to provide additional steps and range of voltage gain.

35 Claims, 18 Drawing Figures

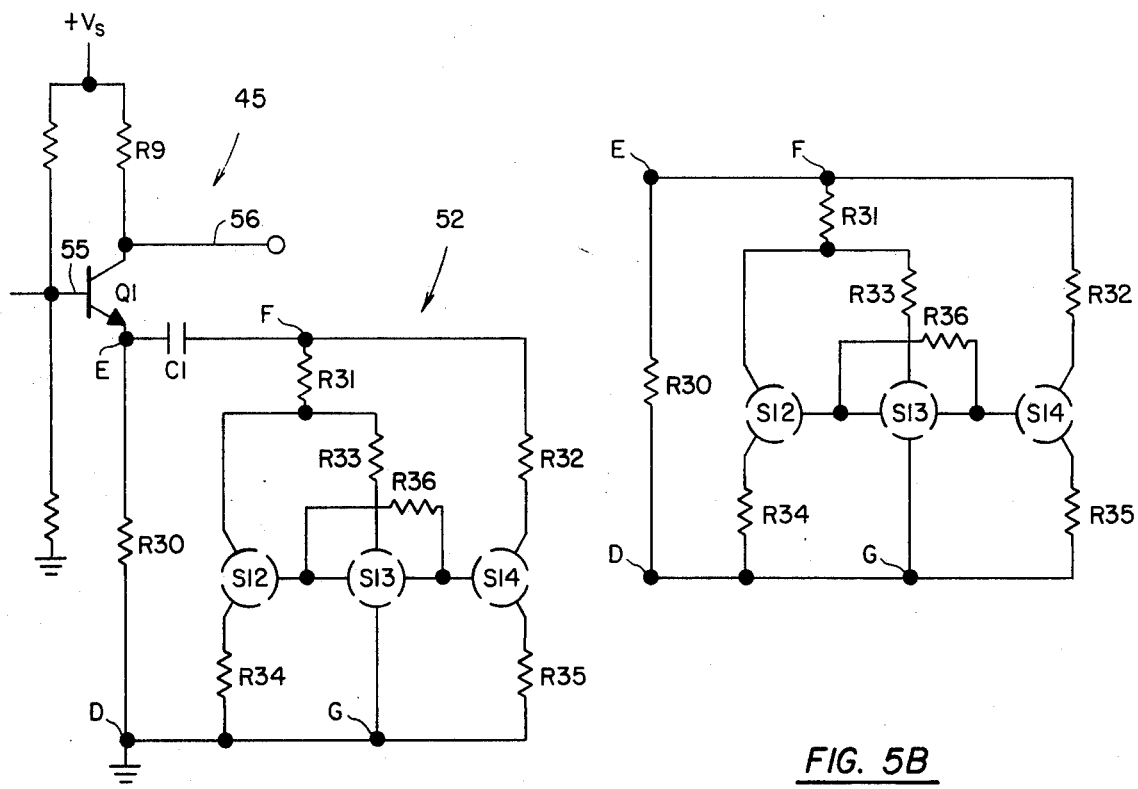
FIG. 5A
FIG. 5B
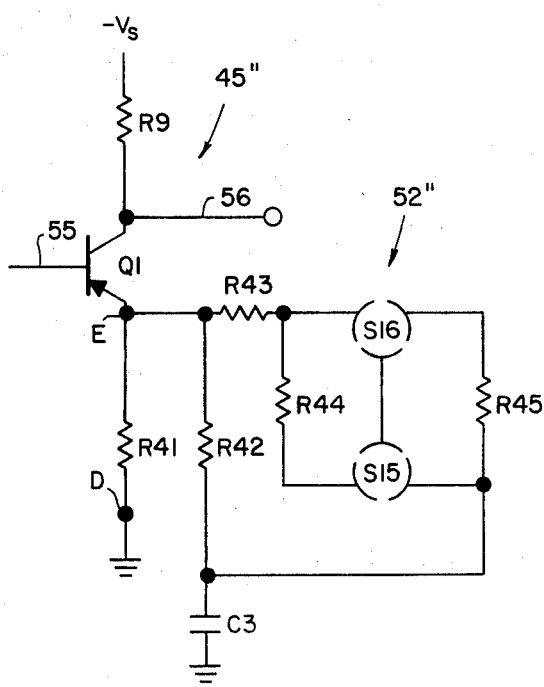
FIG. 6A
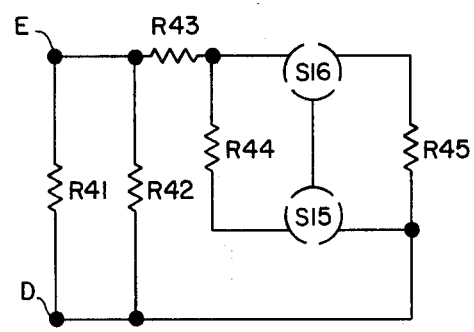
FIG. 6B

|   | 1 | 2 | 3 | 4 | 5 |
|---|---|---|---|---|---|
|   | SCREWS (IN) | $R_{DE}$ | dB | $G_v \approx R_L/R_{DE}$ | SOLVE FOR R (Ω) |
| 1 | NONE | R10 | 0 | 1.0 | R10 = 1.0 |
| 2 | S6 | R10 // (R13+R17) | 2 | 1.26 | R13 = 2.85 |
| 3 | S7 | R10 // (R12+R17) | 4 | 1.58 | R12 = 0.725 |
| 4 | S6, S7 | R10 // R17 | 6 | 2.0 | R17 = 1.0 |
| 5 | NONE | R10 | 9.1 | 2.86 | $R_{DE}$ = 1.62k |
| 6 | S6' | R10 // (R13+R17) | 11.24 | 3.65 | $R_{DE}$ = 1.27k |
| 7 | S7' | R10 // (R12+R17) | 13.56 | 4.76 | $R_{DE}$ = 0.994k |
| 8 | S6', S7' | R10 // R17 | 15.56 | 6.0 | $R_{DE}$ = 0.775k |
| 9 | ((R9 = 4.64kΩ; R10 = 1.62kΩ; R11 = 1.21kΩ; R12 = 1083Ω; R13 = 4383Ω; R14 = 1609Ω; R15 = 19.2kΩ; R17 = 1484Ω )) | | | | |
| 10 | NONE | R23 | 0 | 1.0 | R23 = 1.0 |
| 11 | S8 | R23 // R20 | 1 | 1.12 | R20 = 8.34 |
| 12 | S9 | R23 // R21 | 2 | 1.26 | R21 = 3.85 |
| 13 | S8, S9 | R23 // R20 // R21 // R22 | 3 | 1.41 | R22 = 33.3 |
| 14 | NONE | R24 | 0 | 1.0 | R24 = 1.0 |
| 15 | S10 | R24 / R25 | 1 | 1.12 | R25 = 8.34 |
| 16 | S11 | R24 // (R26+R27) | 2 | 1.26 | R26 + R27 = 3.85 |
| 17 | S10, S11 | R24 // R25 // R26 | 3 | 1.41 | R26 = 3.45 |
|   |   |   |   |   | R27 = 0.4 |
| 18 | NONE | R30 | 0 | 1.0 | R30 = 1.0 |
| 19 | S12 | R30 // (R31+R34) | 1 | 1.12 | R34 = 5.89 |
| 20 | S13 | R30 // (R31+R33) | 2 | 1.26 | R33 = 1.41 |
| 21 | S12, S13 | R30 // R31 | 3 | 1.41 | R31 = 2.44 |
| 22 | S14 | R30 // (R32+R35) | 4 | 1.58 | R35 = 0.0345 |
| 23 | S12, S14 | R30 // (···) | 5 | 1.78 | R36 = 5.620 |
| 24 | S12, S13, S14 | R30 // R31 // R32 | 6 | 2.0 | R32 = 1.69 |
| 25 | NONE | R41 // R42 | 9.1 | 2.86 | $R_{DE}$ = 359 |
| 26 | S15 | (R41 // R42) // (R43+R44) | 10.1 | 3.22 | $R_{DE}$ = 318 |
| 27 | S16 | (R41 // R42) // (R43+R45) | 17.9 | 7.88 | $R_{DE}$ = 130 |
| 28 | S15, S16 | R41 // R42 // R43 | 19.0 | 8.95 | $R_{DE}$ = 114.6 |
| 29 | ((R9 = 1023Ω; R41 = 511Ω; R42 = 1210Ω; R43 = 168Ω; R44 = 2595Ω; R45 = 36Ω )) | | | | |

*FIG. 7*

TRANSISTOR AMPLIFIER STAGE WITH SELECTIVELY ADJUSTABLE GAIN CONTROL CIRCUIT

BACKGROUND OF INVENTION

This invention relates to transistor amplifier stages with gain control circuits, and more particularly to such circuits which cause the decibel value of the net gain of the stage to vary in discrete steps of substantially the same magnitude.

Line amplifiers in telecommunication systems typically have some form of manual gain adjustment for setting levels throughout a system. Gain changes are normally provided in discrete logarithmic (decibel) steps of the same value for convenience. The prior-art line amplifier disclosed in U.S. Pat. No. 3,778,563 uses a resistive L-pad on the input of a fixed gain amplifier. Each section of this L-pad comprises a series resistor between an input line and the input of the amplifier, and a shunt resistor connected to one end of an associated series resistor. A plurality of such sections may be connected in series without substantially changing the input impedance of the amplifier. The decibel values of attenuation per section of the pad therefore add up on a linear basis. The attenuation of the input pad is decreased (i.e., the net gain is increased) by removing sections therefrom. This is accomplished by closing one shunt screw switch to short-circuit the associated series resistor and at the same time opening a series screw switch to open-circuit the associated shunt resistor. Thus, it is seen that at least two screw adjustments are required there for each step change in attenuation or gain. Since the overall gain of this prior-art circuit is adjusted by removing resistive elements from the input circuit thereof, the amplifier following the pad is normally adjusted to have a relatively high gain. Such a high-gain amplifier is inherently more susceptible to noise, oscillation, and increased power drain than an amplifier normally operating at a lower level of gain.

An object of this invention is the provision of an improved variable gain amplifier stage. Another object is the provision of an improved gain control circuit for an amplifier stage in which gain changes provided by individual switch means are cumulative. Another object is the provision of an improved resistive pad.

BRIEF DESCRIPTION OF DRAWINGS

FIGS. 5A and 5B are a schematic circuit diagram and the associated AC circuit equivalent of the emitter circuit of yet another alternate embodiment of the amplifier stage wherein the gain control circuit 52 includes three adjustment screws;

FIGS. 6A and 6B are a schematic circuit diagram and the associated AC circuit equivalent of the emitter circuit of another embodiment of the amplifier stage which was built and successfully operated in series with the circuit of FIG. 2A to provide a broader range and larger number of steps of gain adjustment than are provided by the circuit of FIG. 2A alone;

FIG. 7 is a tabulation disclosing and summarizing the structure and operation of the various embodiments of the amplifier stage which are illustrated in other figures here;

Figure 1A:
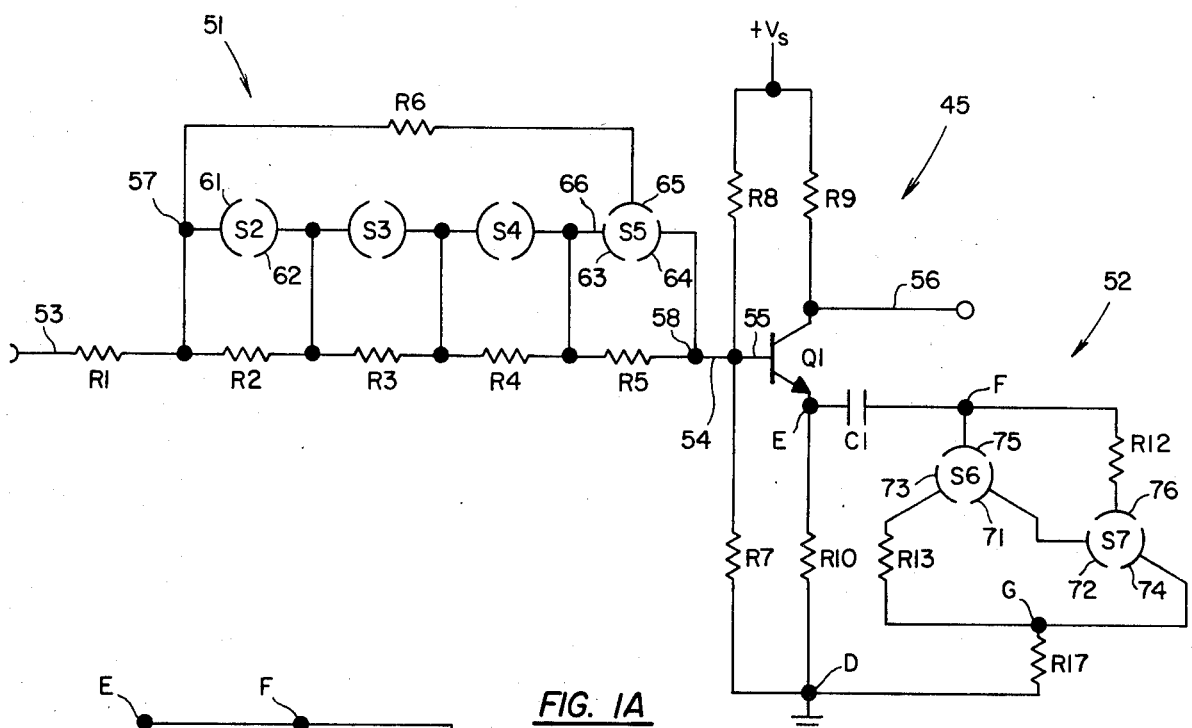
FIG. 1A is a schematic circuit diagram of an amplifier stage embodying this invention and including a pair of gain control circuits 51 and 52 which are associated with transistor Q1.

The same and primed reference characters designate similar elements in the figures. Different reference characters are used to designate other elements such as the emitter resistors R10, R10', R23, etc., however, to make certain and definite which ones of the corresponding elements are designated thereby.

DESCRIPTION OF PREFERRED EMBODIMENTS

Referring now to the preferred embodiment of this invention in FIG. 1A, the amplifier stage there comprises a transistor Q1 having gain control circuits 51 and 52 associated with the base and emitter electrodes, respectively, of the transistor for adjusting the net gain of the stage. The circuit is preferably fabricated on a printed circuit board, although it also may be formed on a ceramic substrate or by other appropriate techniques. An input signal on line 53 is coupled through the gain control circuit 52 to lines 54 and 55 and the base electrode of the transistor Q1. An amplified output signal is coupled on line 56 from the collector electrode of Q1. The Q1 base and collector electrodes are connected to the positive terminal $+V_s$ of a source of supply voltage through bias resistor R8 and load resistor R9, respectively, whereas the ground terminal of the voltage source is connected through bias resistor R7 and emitter resistor R10 to the base and emitter electrodes, respectively, of the transistor.

The gain control circuit 51 is essentially an L-pad comprising the bias resistor R7 which forms one leg of the L-pad; a plurality of resistors R1–R5 that are connected in series between the input line 53 and the Q1 base electrode and which form the other leg of the L-pad; a plurality of screw-type switches S2–S5 which are connected across associated resistors R2–R5, respectively; and a bridging resistor R6 which is connected between switch S5 and the node 57 between resistors R1 and R2. The switches S are preferably similar to those illustrated in U.S. Pat. No. 3,883,682 and FIG. 8.

Figure 8:
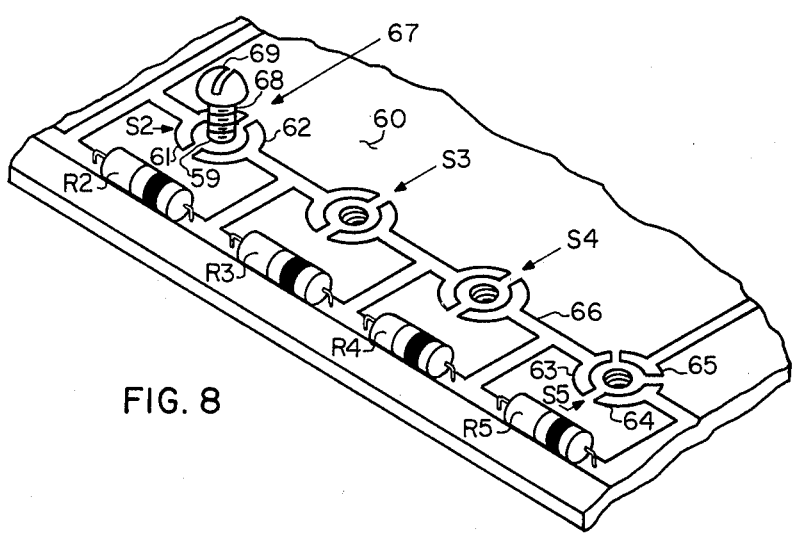
FIG. 8 is a perspective view of a portion of a printed circuit board 60 carrying the circuit 51 and including screw type switches.

Each of the switches S is similar to the switch S2 in FIG. 8 which comprises an aperture 59 in a printed circuit board 60; a pair of spaced-apart electrically conductive arcuate contacts 61 and 62 adjacent to and spaced from the circumference of the aperture 59; and an electrically conductive flathead screw 67. The screws in other switches are not shown for convenience of illustration. The switch S5 has three electrical contacts 63–65. Reference being had to switch S2 and FIG. 8, the shank 68 of the screw 67 is threaded into the aperture 59 associated with this switch. The diameter of the head 69 of the screw is sufficiently large to completely overlap both of the contacts 61 and 62. When switch S2 is in the open position as shown in FIG. 8, the screw is threaded out of the aperture sufficiently far that the head 69 thereof is spaced from and does not make electrical contact with contacts 61 and 62. Switch 67 S2 is closed by inserting the screw fully into the aperture until the underside of the head 69 thereof physically touches both of the contacts 61 and 62 so as to bridge the gap between these spaced-apart contacts and establish electrical continuity therebetween. Although switches such as S2 and S6 are shown in FIG. 1A having two and three contacts, respectively, screw switches having more than three contacts may be employed in alternate embodiments of the amplifier stage. The preferred embodiment of the switch means here is an electrically conductive screw and associated spaced-apart conductors. The switch means S2, S3, etc. may also be straps, shorting plugs, rotary switches having wiper arms contacting a plurality of switch contacts, or other devices satisfying the same functions.

The L-pad of circuit 51 is essentially an attenuator which increases or decreases the level of an input signal on line 53 by selectively reducing or raising the value of net resistance between lines 53 and 54. This circuit 51 is employed here to produce small changes in the net gain of the amplifier stage. When all of the switches S2–S5 are open, the series resistance of circuit 51 is the sum of the resistances of R1–R5, and this circuit has a reference gain, for example, of 0 dB. The gain of circuit 51 is increased one step by closing screw switch S2 to short-circuit R2 and reduce the series resistance in lines 53–54. The circuit 51 gain is increased another step by closing only switch S3 to remove R3 from the circuit and further reduce the series resistance of the L-pad. The decibel values of the changes in gain produced by these switches are cumulative. Thus, when both S2 and S3 are closed, the gain of circuit 51 is the sum of the gains produced by closing the individual switches S2 and S3.

Although the input impedance of amplifier 45 does not remain perfectly constant when the series resistance of circuit 51 is varied, any error can be ignored for small changes in net gain. When the net gain approaches 1 dB, however, (e.g., when S5 is closed to remove R5 from the circuit) the error is approximately 0.1 dB. This error is compensated for in the circuit 51 in FIG. 1A by adding the third contact 65 to S5 and connecting a resistor R6 between this switch S5 and node 57 such that R6 bridges the series combination of resistors R2, R3, and R4. This causes the net series resistance and the gain change provided by closing S5 to be more nearly equal to the desired value. This same correction technique may be applied to other switches where it is deemed warranted.

In an embodiment of the amplifier stage that was built and successfully operated, the decibel value of voltage gain of the circuit 51 was increased in equal steps of 0.1 dB from 0 dB to 1.5 dB by selectively reducing the series impedance in the base circuit of Q1. The operation of circuit 51 is summarized by listing the relative voltage gains of this circuit and the corresponding ones of the switches S2–S5 that are closed to provide such a gain, as follows: 0 dB with all switches open (no switches closed); 0.1 dB for S2 closed; 0.2 dB for S3; 0.3 dB for S2 and S3; 0.4 dB for S4; 0.5 dB for S2 and S4; 0.6 dB for S3 and S4; 0.7 dB for S2, S3, and S4; 0.8 dB for S5; 0.9 dB for S2 and S5; etc. The resistances of resistors in the circuit 51 that was operated were: R1 = 21.35 kilohms, R2 = 450 ohms; R3 = 1050 ohms; R4 = 1900 ohms; R5 = 3400 ohms; R6 = 31.6 kilohms, and R7 = 46.3 kilohms. The contact 65 of switch S5 (with S2, S3, and S4 open) and resistor R6 change the series resistance between nodes 57 and 58 from 3.4 kilohms to 3.07 kilohms.

The gain of amplifier 45 (not including circuit 51) is proportional to the ratio of the load resistance and the emitter resistance for transistors having high $\beta$. The error in this gain approximation is only about 0.1 dB for a transistor with a $\beta$ of 50 and increases for lower values of $\beta$. If an open circuit is inserted between the nodes E and F in FIG. 1A, the amplifier gain is proportional to the ratio of the resistances of R9 and R10. The effective emitter resistance of Q1, and thus the amplifier gain, may be changed by connecting various combinations of resistors in shunt with emitter resistor R10. The gain control circuit 52 in FIG. 1A employs a pair of screw switches S6 and S7 for adjusting the gain of amplifier 45 in discrete steps having the same decibel value. This circuit 52 is employed to produce large changes in the net gain of the amplifier stage, gain changes produced by individual switches S6 and S7 being cumulative.

Figure 1B:
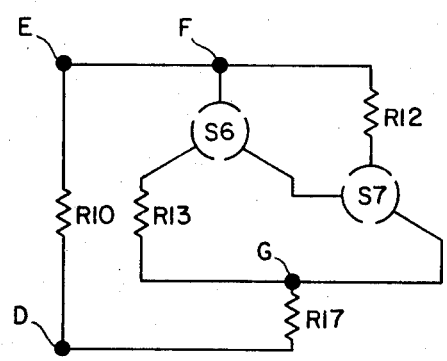
FIG. 1B is a schematic circuit representation of the AC circuit equivalent of the emitter circuit in FIG. 1A including the gain control circuit 52 which controls the effective emitter resistance of transistor Q1 and the gain of amplifier 45.

The gain control circuit 52 in FIGS. 1A and 1B comprises the pair of screw switches S6 and S7 and a pair of resistors R12 and R13 which are electrically connected together in a prescribed manner between nodes F and G. The switch contacts 71 and 72 are directly electrically connected together. The contact 73 of S6 is connected through R13 to node G whereas the contact 74 of S7 is directly electrically connected thereto. Conversely, the contact 75 of S6 is directly electrically connected to node F, whereas the contact 76 of S7 is electrically connected thereto through resistor R12. Node F is AC coupled to node E and one side of emitter resistor R10 through DC blocking capacitor C1. Node G is coupled through resistor R17 to node D and the other side of emitter resistor R10, which is also connected to the ground reference potential. The AC circuit equivalent of the emitter circuit of FIG. 1A is shown in FIG. 1B.

The AC operation of amplifier 45 and gain control circuit 52 is summarized in rows 1–4 of the tabulation in FIG. 7. Column 1 indicates the status of the screw switches S6 and S7, i.e., whether a switch is closed column 2 indicates the effective emitter resistance $R_{DE}$ (between nodes D and E) which is produced by the switches; columns 3 and 4 indicate corresponding decibel values (20 $\log_{10} G_V$) of voltage gain and voltage ratios $G_V = R_L/R_{DE}$ of the amplifier, respectively; and column 5 lists normalized values of resistances of resistors where $R_L = R10 = 1$ ohm.

Briefly, when S6 and S7 are both open (FIG. 7, row 1), the 0 dB reference gain of amplifier 45 is determined by an effective emitter resistance $R_{DE}$ which is equal to the resistance of R10. The 0 dB reference gain is increased 2 dB by closing only S6 (FIG. 7, row 2). This gain change is accomplished by connecting the series combination of resistors R13 and R17 in parallel with R10 to decrease the effective emitter resistance $R_{DE}$. The decibel value of voltage gain is increased another 2 dB by opening S6 and closing S7 (FIG. 7, row 3) to connect the series combination of resistors R12 and R17 in parallel with R10 to further decrease the value of the effective emitter resistance $R_{DE}$. Finally, the decibel value of voltage gain of amplifier 45 is again increased by the same amount to 6 dB by closing both of the switches S6 and S7 to short-circuit resistors R12 and R13 and connect R17 in parallel with emitter resistor R10 (FIG. 7, row 4). Normalized resistance values of the resistors are shown in column 5. Actual values of resistances for these resistors may be computed as is well known in the art, e.g., by selecting values of $R_L$ and/or R10 and multiplying other resistances by corresponding factors. Although 2 dB changes in gain are indicated for the circuit 52 in FIG. 1A, other values of gain change may be obtained by selecting the resistance of one resistor and scaling the resistances of the other resistors. A reference gain of other than 0 dB, e.g., to compensate for losses in the input circuit, may be obtained by making the resistance ratio $R_L/R_{DE}$ other than unity.

The emitter circuit in FIG. 1A includes a DC blocking capacitor C1 between nodes E and F. The DC bias current through R10 sets the operating point of the amplifier. The effective AC emitter resistance in FIG. 1B determines the gain of the amplifier. In an alternate form of the structure coupling the circuit 52 to the emitter resistor R10, the capacitor C1 is replaced by a short circuit between nodes E and F, and node G is also connected through a bias resistor (not shown) to a source of positive supply potential. In this alternate circuit, the bias resistor corresponding to R17 between ground and node G, and the bias resistor between node G and the supply voltage are selected to provide the same DC bias voltages at nodes E and G. Since these nodes E and G are at the same DC potential, DC current will not flow through 52. The same DC bias current as before will flow through R10 to set the operating point of amplifier 45, however, even when values of resistance in circuit 52 are changed. This means that the operating point of Q1 will be unaffected by resistance changes in circuit 52 so as to prevent a shift in the output level of the amplifier. It is the effective AC emitter resistance that changes and determines the gain of amplifier 45. The AC equivalent of this alternate structure is the same as that shown in FIG. 1B where the resistance of the parallel combination of the two DC bias resistors that are electrically connected between ground and node G, and between node G and the source of bias voltage, is equal to the resistance of R17.

Figure 2B:
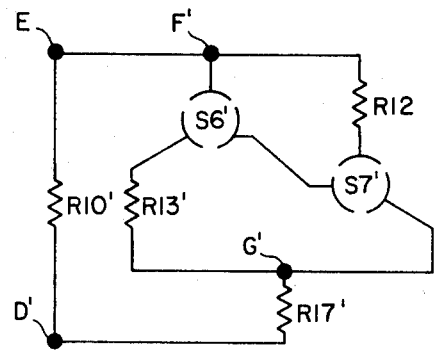
FIG. 2B is a schematic circuit representation of the AC circuit equivalent of the emitter circuit in FIG. 2A and is the same as that shown in FIG. 1B for the amplifier stage illustrated in FIG. 1A.
Figure 2A:
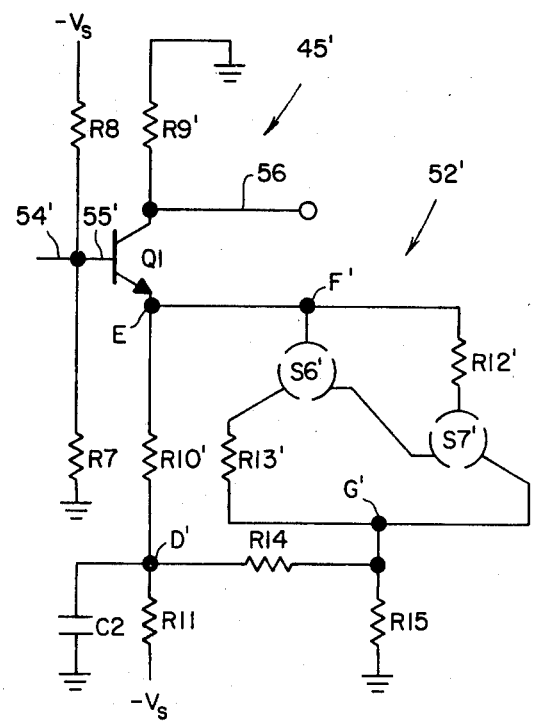
FIG. 2A is a schematic circuit diagram of an alternate embodiment of the amplifier stage which was built and tested, the gain control circuit 52' here being DC coupled to the emitter of transistor Q1.

An alternate embodiment of the amplifier stage which was built and successfully operated is illustrated in FIG. 2A. The circuits in FIGS. 1A and 2A are similar, principal differences being that the DC blocking capacitor C1 is omitted in FIG. 2A, that the load resistor R9' is connected to ground, and that the emitter resistor R10' is connected through a DC bias resistor D11 to a source of negative supply voltage $-V_s$. An AC bypass capacitor C2 is connected between node D' and ground to effectively remove resistor R11 from the AC equivalent circuit in FIG. 2B. A first bias resistor R14 is connected between the node G' and the DC reference voltage at node D' in FIG. 2A. A second DC bias resistor R15 is connected between node G' and ground. The resistors R14 and R15 cause the DC bias voltages at nodes E and G' to be the same value. As was stated above, this prevents changes in the resistance of circuit 52' changing the DC bias level of amplifier 45' and accomplishes the same purpose as the AC coupling capacitor C1 in FIG. 1A. The AC circuit equivalent of the emitter circuit in FIG. 2A is illustrated in FIG. 2B. Reference to FIGS. 1B and 2B reveals that the emitter circuits in FIGS. 1A and 2A have the same AC equivalent circuits wherein the resistor R17' has a resistance equal to that of the parallel combination of resistors R14 and R15.

The operation of amplifier 45' in FIGS. 2A and 2B is summarized in rows 5 – 9 of FIG. 7. In this example, the quantities listed in columns 3, 4, and 5 of rows 5 – 8 represent actual values provided by the circuit which was built and successfully operated (where the resistors had resistance values listed in row 9). In this embodiment of the amplifier stage in FIG. 2A, the reference gain is 9.1 dB instead of 0 dB in order to compensate for loss in circuits preceding transistor Q1. Each step change in voltage gain in column 3, lines 5 – 8, is approximately 2 dB.

In an alternate embodiment of the circuit in FIG. 2A, the resistor R10' is connected directly to the negative supply voltage $-V_s$, and the resistor R14 is connected directly to a bias voltage source instead of to the node D'. In another alternate embodiment of the circuit of FIG. 2A, an AC coupling capacitor is connected in the line between nodes E and F'; the resistor R14 is connected in parallel with R15 instead of to the node D'; and capacitor C2 and R11 may be omitted such that the resistor R10' and node D' are directly connected to the negative supply voltge $-V_s$. The AC circuit equivalents of both of these alternate embodiments of the circuit in FIG. 2A are the same as that shown in FIG. 2B.

Figure 3A:
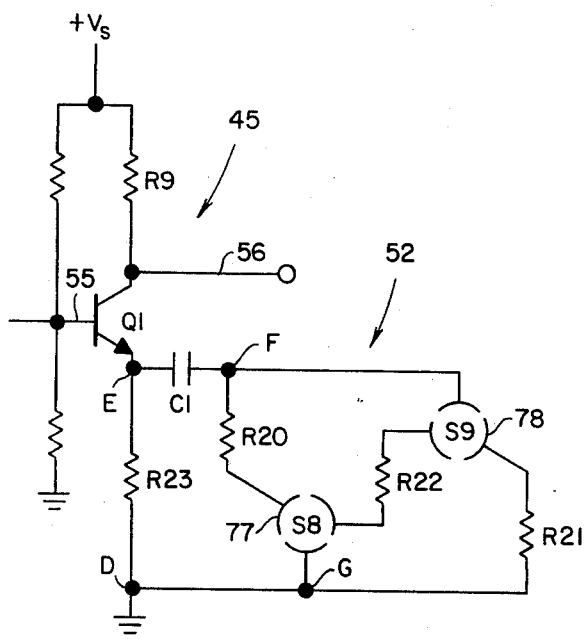
FIGS. 3A and 3B are a schematic circuit diagram and the associated AC circuit equivalent of the emitter circuit of another alternate embodiment of the amplifier stage wherein the gain control circuit 52 also includes a pair of adjustment screws.
Figure 3B:
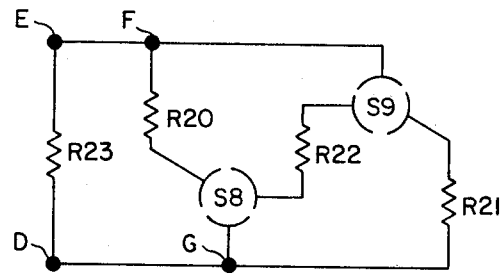

Another embodiment of the amplifier stage employing a pair of screw switches and the AC circuit equivalent of the emitter circuit thereof are illustrated in FIGS. 3A and 3B respectively. The operation of switches S8 and S9 in controlling the gain of amplifier 45 is summarized in lines 10 – 13 in FIG. 7 for incremental changes in gain of 1 dB. In the alternate embodiment of the amplifier stage in FIG. 3A where coupling capacitor C1 is replaced with a short circuit, the line between nodes D and G is replaced with an open circuit and the node G is connected through associated bias resistors to the positive supply voltage $+V_s$ and ground. An AC bypass capacitor similar to the capacitor C2 in FIG. 2A may be connected between the node G and ground for effectively bypassing these bias resistors such that the AC circuit equivalent of the emitter circuit for this alternate embodiment of the amplifier stage is the same as that in FIG. 3B. If this AC bypass capacitor is omitted, the AC equivalent circuit there includes a resistor between nodes D and G in FIG. 3B in place of the short circuit that is shown there. The resistance of the various resistors may then be computed by trial and error or with the aid of a computer.

Another alternate embodiment of the amplifier stage is similar to the circuit of FIG. 3A, except that the resistor R22 is electrically connected between the contacts 77 and 78 of associated switches S8 and S9 such that the emitter resistor R23 is normally electrically connected in parallel with the series combination of resistors R20, R21, and R22 when S8 and S9 are open. The expressions for the effective emitter resistance $R_{DE}$ in this example are move complex than those shown in FIG. 7, lines 10 - 13, for the circuit of FIG. 3A and require more complex analysis techniques to identify particular values of the resistors.

Figure 4A:
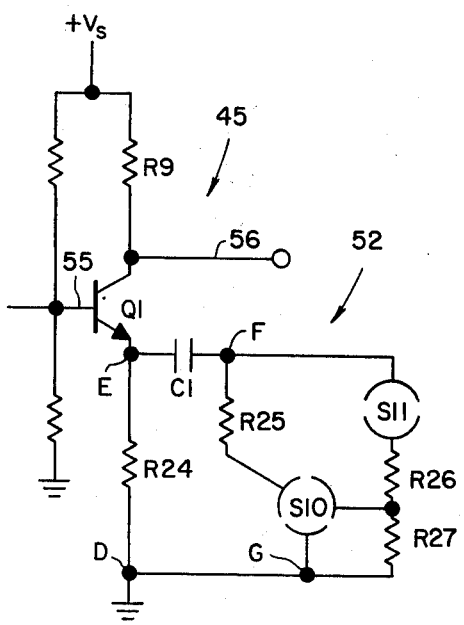
FIGS. 4A and 4B are a schematic circuit diagram and the associated AC circuit equivalent of the emitter circuit of a further alternate embodiment of the amplifier stage wherein the gain control circuit 52 here also includes a pair of adjustment screws.
Figure 4B:
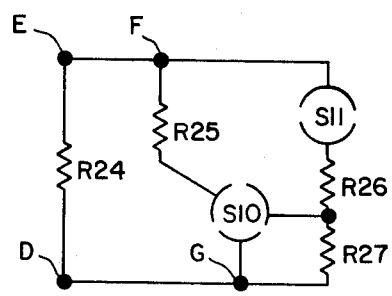

A further alternate embodiment of the amplifier stage employing only two screw switch means and the AC circuit equivalent of the emitter circuit thereof are illustrated in FIGS. 4A and 4B, respectively. The operation of this circuit is summarized in lines 14 - 17 in FIG. 7. This embodiment of the amplifier stage may also be modified to eliminate the coupling capacitor C1 between nodes E and F in the manner described above.

The embodiments of the amplifier stages in FIGS. 1A, 2A, 3A, and 4A employ only two screw switches to provide four different levels of voltage gain that are spaced apart by equal amounts. The number of different levels of voltage gain and the range of adjustment provided by the circuit may also be increased by increasing the number of screw switches in the gain control circuit 52. An embodiment of the amplifier stage employing three screw switches in the emitter circuit of amplifier 45 and providing six different levels of voltage gain that are spaced apart by the same amount, and the AC circuit equivalent of this emitter circuit are illustrated in FIGS. 5A and 5B, respectively. The operation of this circuit is summarized in lines 18 - 24 in FIG. 7. The normalized value of the resistance of R36 is computed by transforming back-to-back delta resistive networks (which occur when switches S12 and S14 are closed) into a pair of Y-networks which are then solved for R36. Although circuits employing more than three switches may be designed for providing amplifiers with greater numbers of different levels of equally spaced-apart voltage gain, the solution of such circuits becomes increasingly more difficult.

Although the step changes in gain in individual circuits in FIGS. 1A, 2A, 3A, 4A, and 5A are of the same value, and the gain changes provided by individual screw switches are all cumulative, the elements of gain control circuits 52 may be selected and arranged to provide step changes in gain which are not equal. By way of example, the resistors and switches in FIG. 6A are connected such that switches S15 and S16 provided gain changes of 1 and 8 dB, respectively (see rows 25 -29 in FIG. 7).

Figure 12:
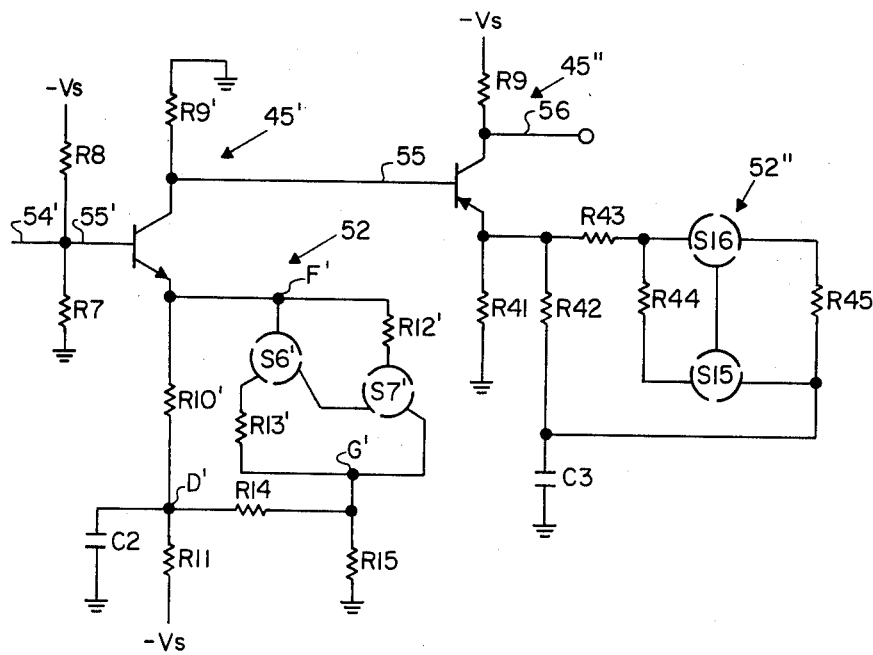
FIG. 12 is a schematic circuit diagram of an amplifier embodying this invention in which the amplifier circuits in FIGS. 2A and 6A are cascaded to provide additional range and steps of the net overall voltage gain.

The number of different levels of voltage gain and the range of adjustment provided by a circuit employing this invention may also be increased by cascading the input gain circuit 51 and the amplifier 45 with associated circuit 52, and by cascading amplifiers 45 including associated gain control circuits 52 (see FIG. 12). A relatively simple amplifier circuit providing 15 different levels of voltage gain that are spaced apart by the same amount was obtained in an embodiment of the amplifier stage that was built and successfully operated by cascading the amplifier circuit 45' in FIG. 2A and 45" in FIG. 6A. In the resultant circuit in FIG. 12, the line 56 in FIG. 2A is essentially connected to line 55 in FIG. 6A. In this circuit, the decibel value of the net voltage gain is variable from 0 to 15 dB in increments of 1 dB for selected combinations of the switches S6', S7', S15, and S16. This operation may be briefly summarized by listing particular ones of the switches in FIGS. 2A and 6A which are closed to provide particular decibel values of voltage gain (where S6' = 2 dB, S7' = 4 dB, S15 = 1 dB, S16 = 8 dB), as follows: 0 dB for no switches closed; 1 dB for S15 closed; 2 dB for S6' ; 3 dB for S6' and S15; 4 dB for S7'; 5 dB for S7' and S15; 6 dB for S6' and S7'; 7 dB for S6', and S15; 8 dB for S16; 9 dB for S15 and S16; 10 dB for S6' and S16, 11 dB for S6', S15, and S16; 12 dB for S7' and S16; 13 dB for S7', S15, and S16; 14 dB for S6', S7', and S16; and 15 dB for S6', S7', S15, and S16 being closed. The number of different equally spaced-apart levels of net voltage gain was further increased and the magnitude of the changes in gain decreased by operating these two amplifiers with the gain control circuit 51 in FIG. 1A. The resultant amplifier stage provided relative changes in gain from 0 dB to 16.5 dB in 0.1 dB steps.

Figure 9:
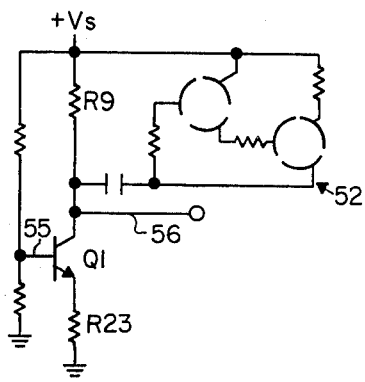
FIG. 9 is a schematic circuit diagram of a common emitter amplifier stage in which a gain control circuit 52 is connected across the collector-load resistor R9 there.
Figure 10:
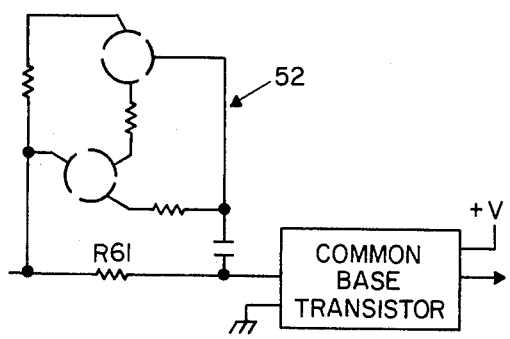
FIG. 10 is a schematic circuit and block diagram of a common base amplifier stage including a gain control circuit 52.
Figure 11:
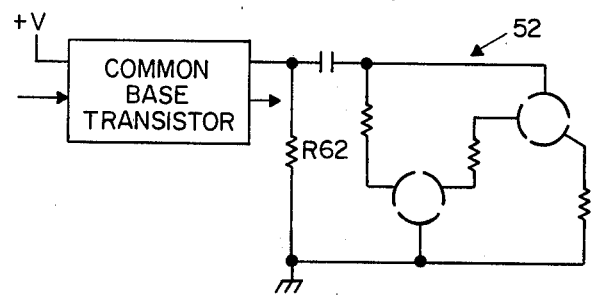
FIG. 11 is a schematic circuit diagram of a common base amplifier stage including a gain control circuit 52.

Although this invention is described in relation to specific preferred embodiments thereof, modifications and alternate designs will occur to those skilled in the art. By way of example, a particular one of the resistors in a gain control circuit may have a negative resistance. In FIG. 1A, the bridging resistor R6 in pad 51 may be connected to another switch means, e.g., S3, or be in the line 66. Further, a switch means may be connected across several series resistors and the same series resistor may be one of groups thereof associated with different switch means. Also, the resistances of the resistors in FIG. 3A, for example, may be selected to provide incremental step changes in voltage gain which are of a magnitude other than 1 dB. Although the values of voltage gain in the drawings are shown as providing increases in amplifier gain by connecting resistors in parallel with emitter resistor R10, the gain of the amplifier may also be adjusted by removing resistance from the emitter circuit to increase the effective emitter resistance and to decrease the gain of the circuit. The amplifier gain may also be adjusted by connecting a gain control circuit 52 to any resistive element such as the base or load resistor that controls the gain of the associated transistor (see FIG. 9). The resistors of the emitter gain control circuit may also be selectively interconnected through multicontact rotary switches (not shown), having certain contacts thereof connected to the resistors and other contacts thereof open circuited. Although a common emitter transistor amplifier is shown in the figures here, a common base or common collector configuration or operational amplifier circuit may be employed (see FIGS. 10 and 11). Also, the gain control circuit 52 may be located in the base circuit of a transistor (see FIG. 11). The scope of this invention is therefore determined from the attached claims rather than the above detailed description of embodiments thereof.

What is claimed is:

1. A variable gain amplifier comprising:
   a transistor;
   a resistive element operatively connected to said transistor for determining the gain of the amplifier; and
   means electrically connected in parallel with said resistive element for producing in the AC circuit equivalent of the amplifier step changes in the net resistance measured across said resistive element that are of magnitudes to produce step changes in the decibel value of the voltage gain of the amplifier; said producing means comprising in the AC circuit equivalent of the amplifier a plurality of control resistors, a plurality of bi-state switch means, the state of at least a certain one of said switch means being changed to produce a step change in the net resistance measured across said resistive element and the gain of the amplifier, and first connecting means electrically connecting said resistors and said switch means together in a prescribed pattern across said resistive element which requires that changing the states of individual switch means produces associated prescribed step changes in the decibel value of voltage gain of the amplifier that are cumulative when the status of more than one switch means are changed.

2. The amplifier according to claim 1 wherein changing the states of said switch means in a particular manner produces step changes in the decibel value of voltage gain of the amplifier of substantially the same magnitude.

3. The amplifier according to claim 1 wherein said transistor is connected in a common emitter configuration and said resistive element is an emitter resistor connected in series with the emitter electrode of said transistor.

4. The amplifier according to claim 3 wherein said producing means includes a DC blocking capacitor electrically connected between one end of said pattern of control resistors and switch means and one end of said emitter resistor.

5. The amplifier according to claim 1 wherein said transistor is connected in a common base configuration and said resistive element is an emitter resistor connected in series with the emitter electrode of said transistor.

6. The amplifier according to claim 1 wherein said transistor is connected in a common base configuration and said resistive element is a base resistor electrically connected in series with the base electrode of said transistor.

7. In combintion with the amplifier of claim 1 wherein said first-named transistor is connected in a common emitter configuration and said resistive element is an emitter resistor electrically connected in series with the emitter and collector electrodes of said first-named transistor, a second variable gain amplifier comprising:
a second transistor operatively connected in a common emitter configuration with the base electrode thereof electrically connected to the collector electrode of the first-named transistor;
a second emitter resistor electrically connected in series with the emitter electrode of said second transistor for determining the gain of the second amplifier;
a plurality of second control resistors;
a plurality of second switch means; and
second connecting means electrically connecting in the AC circuit equivalent of the second amplifier said pluralities of second control resistors and second switch means together in a prescribed second pattern across said second emitter resistor, the state of at least a certain one of said second switch means being changed to produce a step change in the net resistance measured across said second emitter resistor and the gain of the second amplifier, which requires that changing the states of switch means of the first-named and the second amplifiers in a prescribed manner produces step changes in the decibel values of net voltage gain of the two amplifiers of substantially the same magnitude.

8. A variable gain amplifier comprising:
a transistor having emitter and collector electrodes;
first and second resistive elements operatively connected to said transistor emitter and collector electrodes, respectively, for determining the amplifier gain which is proportional to the ratio of the resistances of said second and first resistive elements; and
means electrically connected in parallel with one of said resistive elements for producing in the AC circuit equivalent of the amplifier step changes in the net resistance measured across said one resistive element that are of magnitudes to produce step changes in the decibel value of the voltage gain of the amplifier; said producing means comprising in the AC circuit equivalent of the amplifier a plurality of control resistors, a plurality of bi-state switch means, the state of at least a certain one of said switch means being changed to produce a step change in the net resistance measured across said one resistive element and the gain of the amplifier, and first connecting means electrically connecting said resistors and said switch means together in a prescribed pattern across said one resistive element which requires that changing the states of individual switch means produces associated prescribed step changes in the decibel value of voltage gain of the amplifier that are cumulative when the status of more than one switch means are changed.

9. A variable gain amplifier comprising:
a transistor connected in a common emitter configuration and having an emitter electrode;
a resistive element which is an emitter resistor operatively connected in series with said emitter electrode of said transistor for determining the gain of the amplifier;
a ground reference point;
a source of DC power; and
means electrically connected in parallel with said resistive element for producing in the AC circuit equivalent of the amplifier step changes in the net resistance measured across said resistive element that are of magnitudes to produce step changes in the decibel value of the voltage gain of the amplifier: said producing means comprising in the AC circuit equivalent of the amplifier a plurality of control resistors; a plurality of bi-state switch means, the state of at least a certain one of said switch means being changed to produce a step change in the net resistance measured across said resistive element and the gain of the amplifier; and first connecting means electrically connecting said resistors and said switch means together in a prescribed configuration across said resistive element which requires that changing the states of individual switch means produces prescribed step changes in the decibel value of voltage gain of the amplifier that are cumulative, with one end of said pattern of control resistors and switch means being DC coupled to the emitter electrode of said resistor, and including resistive bias means having first, second, and third terminals electrically connected to said ground reference point, said power source and the other end of said pattern of control resistors and switch means, respectively, for producing the same DC voltage at both ends of said pattern of control resistors and switch means.

10. A variable gain amplifier comprising:

a transistor having emitter and collector electrodes;

first and second resistive elements operatively connected to said transistor emitter and collector electrodes, respectively, for determining the amplifier gain which is proportional to the ratio of the resistances of said second and first resistive elements; and means electrically connected in parallel with one of said resistive elements for producing in the AC circuit equivalent of the amplifier step changes in the net resistive measured across said one resistive element that are of magnitudes to produce step changes in the decibel value of the voltage gain of the amplifier; said producing means comprising in the AC circuit equivalent of the amplifier a plurality of control resistors, a plurality of bi-state switch means, the state of at least a certain one of said switch means being changed to produce a step change in the net resistance measured across said one resistive element and the gain of the amplifier, and first connecting means electrically connecting said resistors and said switch means together in a prescribed pattern across said one resistive element which requires that changing the states of individual switch means produces different prescribed step changes in the decibel value of voltage gain of the amplifier that are cumulative;

said pattern of control resistors and switch means, and said one resistive element together comprising in the AC circuit equivalent thereof;

said one resistive element;

first, second, and third control resistors; and first and second switch means each having at least three electrical contacts;

said first resistor having one terminal thereof directly electrically connected to one terminal of said one resistive element and having the other terminal thereof electrically connected through said second resistor and directly electrically connected to first contacts of said first and second switch means, respectively; the other terminal of said one resistive element being directly electrically connected and connected through said third resistor to second contacts of said first and second switch means, respectively; the third contacts of said first and second switch means being directly electrically connected together; the electrical contacts of a particular switch means being electrically short-circuited together when the associated switch means is in the closed state.

11. The amplifier according to claim 10 wherein changing the states of said first and second switch means in a prescribed manner produces step changes in the decibel value of voltage gain of the amplifier, which are of substantially the same magnitude.

12. A variable gain amplifier comprising:

a transistor having emitter and collector electrodes;

first and second resistive elements operatively connected to said transistor emitter and collector electrodes, respectively, for determining the amplifier gain which is proportional to the ratio of the resistances of said second and first resistive elements; and means electrically connected in parallel with one of said resistive elements for producing in the AC circuit equivalent of the amplifier step changes in the net resistance measured across said one resistive element that are of magnitudes to produce step changes in the decibel value of the voltage gain of the amplifier; said producing means comprising in the AC circuit equivalent of the amplifier a plurality of control resistors, a plurality of bi-state switch means, the state of at least a certain one of said switch means being changed to produce a step change in the net resistance measured across said one resistive element and the gain of the amplifier, and first connecting means electrically connecting said resistors and said switch means together in a prescribed pattern across said one resistive element which requires that changing the states of individual switch means produces different prescribed step changes in the decibel value of voltage gain of the amplifier that are cumulative the AC circuit equivalent of the parallel combination of said one resistive element and said pattern of control resistors and switch means comprising:

said one resistive element;

first, second, and third control resistors; and first and second switch means each having at least three electrical contacts;

one terminal of said one resistive element being directly electrically connected and connected through said first control resistor to first contacts of said first and second switch means, respectively; the other terminal of said one resistive element being connected through said second control resistor and directly electrically connected to second contacts of said first and second switch means, respectively; the third contacts of said first and second switch means being electrically connected together through said third resistor; the electrical contacts of a particular switch means being electrically short-circuited together when the associated switch means is in the closed state.

13. The amplifier according to claim 12 wherein changing the stages of said first and second switch means in a prescribed manner produces step changes in the decibel value of the voltage gain of the amplifier of substantially the same magnitude.

14. The amplifier according to claim 13 wherein each of said first and second swich means comprises a screw switch having at least three electrically conductive switch contacts which are spaced apart around the circumference of an aperture in a substrate and an electrically conductive screw having a head thereof that extends over at least a portion of each of said switch contacts and which short-circuits the latter together when said switch is closed.

15. A variable gain amplifier comprising:

a transistor having emitter and collector electrodes;

first and second resistive elements operatively connected to said transistor emitter and collector electrodes, respectively, for determining the amplifier gain which is proportional to the ratio of the resistances of said second and first resistive elements; and means electrically connected in parallel with one of said resistive elements for producing in the AC circuit equivalent of the amplifier step changes in the net resistance measured across said one resistive element that are of magnitudes to produce step changes in the decibel value of the voltage gain of the amplifier; said producing means comprising in the AC circuit equivalent of the amplifier a plurality of control resistors, a plurality of bi-state switch means, the stage of at least a certain one of said switch means being changed to produce a step change in the net resistance measured across said one resistive element and the gain of the amplifier, and first connecting means electrically connecting said resistors and said switch means together in a prescribed pattern across said one resistive element which requires that changing the states of individual switch means produces different prescribed step changes in the decibel value of voltage gain of the amplifier that are cumulative;

said pattern of control resistors and switch means, and said one resistive element comprising in the AC circuit equivalent thereof;

said one resistive element;

first, second, and third control resistors;

a first screw switch including at least three electrically conductive switch contacts which are spaced apart around the circumference of an aperture in a dielectric substrate supporting said resistors and including a first electrically conductive screw having a shank threaded into the aperture and having a head which overlaps at least a portion of each of said contacts of said first screw switch; and a second screw switch including at least a pair of electrical contacts spaced apart about the circumference of an aperture in the dielectric substrate supporting said resistors and including a second electrically conductive screw having a shank threaded into the second aperture and an electrically conductive head overlapping at least a portion of the two contacts of said second screw switch;

one terminal of said one resistive element being directly electrically connected and connected through said first resistor to first contacts of said second and first switches, respectively; the other terminal of said second switch being electrically connected through said second resistor to the second contact of said first switch and to one terminal of said third resistor; the other terminal of said one resistive element being electrically connected to the third terminal of said first switch and to the other terminal of said third resistor; the electrical contacts of a particular screw switch being electrically short-circuited together when the associated screw switch is in the closed state.

16. A variable gain amplifier comprising:

a transistor having emitter and collector electrodes;

first and second resistive elements operatively connected to said transistor emitter and collector electrodes, respectively, for determining the amplifier gain which is proportional to the ratio of the resistances of said second and first resistive elements; and means electrically connected in parallel with one of said resistive elements for producing the the AC circuit equivalent of the amplifier step changes in the net resistance measured across said one resistive element that are of magnitudes to produce step changes in the decibel value of the voltage gain of the amplifier; said producing means comprising in the AC circuit equivalent of the amplifier a plurality of control resistors, a plurality of bi-state switch means, the state of at least a certain one of said switch means being changed to produce a step change in the net resistance measured across said one resistive element and the gain of the amplifier, and first connecting means electrically connecting said resistors and said switch means together in a prescribed pattern across said one resistive element which requires that changing the states of individual switch means produces different prescribed step changes in the decibel value of voltage gain of the amplifier that are cumulative;

said pattern of control resistors and switch means in combination with said one resistive element comprising in the AC circuit equivalent thereof;

said one resistive element;

first, second, and third control resistors;

first switch means having at least a pair of contacts; and second switch means having at least three electrical contacts;

one end of said one resistive element being directly electrically connected and being connected through said first control resistor to first contacts of said first and second switch means, respectively; the other contact of said first switch means being electrically connected through said second resistor to a second contact of said second switch means and to one terminal of the said third resistor; the other terminal of said one resistive element being directly electrically connected to the third contact of said second switch means and to the other terminal of said third resistor; the electrical contacts of a particular switch means being electrically short-circuited together when the associated switch means is in the closed state.

17. The amplifier according to claim 16 wherein changing the states of said switch means in a prescribed manner produces step changes in the decibel value of the voltage gain of the amplifier of substantially the same magnitude.

18. A variable gain amplifier comprising:

a transistor having emitter and collector electrodes;

first and second resistive elements operatively connected to said transistor emitter and collector electrodes, respectively, for determining the amplifier gain which is proportional to the ratio of the resistances of said second and first resistive elements; and means electrically connected in parallel with one of said resistive elements for producing in the AC circuit equivalent of the amplifier step changes in the net resistance measured across said one resistive element that are of magnitudes to produce step changes in the decibel value of the voltage gain of the amplifier; said producing means comprising in the AC circuit equivalent of the amplifier a plurality of control resistors, a plurality of bi-state switch means, the state of at least a certain one of said switch means being changed to produce a step change in the net resistance measured across said one resistive element and the gain of the amplifier, and first connecting mans electrically connecting said resistors and said switch means together in a prescribed pattern across said one resistive element which requires that changing the states of individual switch means produces different prescribed step changes in the decibel value of voltage gain of the amplifier that are cumulative;

the AC equivalent circuit of said one resistive element and said producing means comprising:
said one resistive element;
first, second, third, fourth, fifth, and sixth control resistors;
first and second switch means each having at least three electrical contacts; and
third switch means having at least four electrical contacts;
one terminal of said one resistive element being electrically connected through said first and second control resistors to one terminals of said first and second switch means, respectively; the one terminal of said first switch means also being connected through said third control resistor to the first contact of said third switch means; the other terminal of said one resistive element being electrically connected through said fourth resistor, through said first resistor and directly electrically connected to the second contacts of said first, second, and third switch means, respectively; the third contacts of said first and third switch means both being connected through said sixth resistor to the third and fourth contacts of said second and third switch means, respectively; the electrical contacts of a particular switch means being electrically short-circuited together when the associated switch means is in the closed state.

19. The amplifier according to claim 18 wherein changing the stages of said switch means in a prescribed manner produces step changes in the decibel value of voltage gain of the amplifier of substantially the same magnitude.

20. A variable gain amplifier comprising:
a transistor having emitter and collector electrodes;
first and second resistive elements operatively connected to said transistor emitter and collector electrodes, respectively, for determining the amplifier gain which is proportional to the ratio of the resistances of said second and first resistive elements; and
means electrically connected in parallel with one of said resistive elements for producing in the AC circuit equivalent of the amplifier step changes in the net resistance measured across said one resistive element that are of magnitudes to produce step changes in the decibel vaue of the voltage gain of the amplifier; said producing means comprising in the AC circuit equivalent of the amplifier a plurality of control resistors, a plurality of bi-state switch means, the state of at least a certain one of said switch means being changed to produce a step change in the net resistance measured across said one resistive element and the gain of the amplifier, and first connecting means electrically connecting aid resistors and said switch means together in a prescribed pattern across said one resistive element which requires that changing the states of individual switch means produces different prescribed step changes in the decibel value of voltage gain of the amplifier that are cumulative;
the AC circuit equivalent of said pattern of control resistors and switch means together with said one resistive element comprising in the AC equivalent circuit thereof;
said one resistive element;
first, second, third, and fourth resistors; and
first and second switch means each having at least three electrical contacts;
one terminals of said one resistive element and said first control resistor being directly electrically connected and connected through said second control resistor to first contacts of said first and second switch means, respectively; the other terminals of said one resistive element and first control resistor being electrically connected through the series combination of said third and fourth control resistors and through said third control resistor to second contacts of said first and second switch means, respectively; the third contacts of said first and second switch means being directly electrically connected together; the electrical contacts of a particular switch means being electrically short-circuited together when the associated switch means is in the closed state.

21. The amplifier according to claim 20 wherein changing the states of said switch means in a prescribed manner produces step changes in the decibel value of voltage gain of the amplifier of substantially the same magnitude.

22. A variable gain amplifier comprising:
a transistor connected in a common emitter configuration and having a collector electrode;
a resistive element which is a load resistor operatively connected in series with the collector electrode of said transistor for determining the gain of the amplifier; and
means electrically connected in parallel with said resistive element for producing in the AC circuit equivalent of the amplifier step changes in the net resistance measured across said resistive element that are of magnitudes of produce step changes in the decibel value of the voltage gain of the amplifier; said producing means comprising in the AC circuit equivalent of the amplifier a plurality of control resistors, a plurality of bi-state switch means, the state of at least a certain one of said switch means being changed to produce a step change in the net resistance measured across said resistive element and the gain of the amplifier, and first connecting means electrically connecting said resistors and said switch means together in a prescribed pattern across said resistive element which requires that changing the stages of individual switch means produces different prescribed step changes in the decibel value of voltage gain of the amplifier that are cumulative.

23. A resistive pad having an attenuation between an input and an output terminal, measured with respect to a reference point, that is variable in discrete steps and having a net resistance between the input and output terminals, comprising:
first and second resistive elements;
first means electrically connecting one of said first and second resistive elements between the input and output terminals and electrically connecting the other of said first and second resistive elements between the reference point and one side of said one resistive element;
a plurality of control resistors;
a plurality of bi-state switch means; and
second means electrically connecting said control resistors and switch means together in a prescribed pattern across said first and second terminals of said first resistive element, the state of at least a certain one of said switch means being changed to produce a step change in the net resistance measured across said first resistive element, which requires that changing the states of individual switch means produce different prescribed step changes in the decibel value of attenuation that are cumulative.

24. A resistive pad having an attenuation between an input and an output terminal, measured with respect to a reference point, that is variable in discrete steps and having a net resistance between the input and output terminals, comprising:
first and second resistive elements;
first means electrically connecting one of said first and second resistive elements between the input and output terminals and electrically connecting the other of said first and second resistive element;
a plurality of control resistors;
a plurality of bi-state switch means; and
second means electrically connecting said control resistors and switch means together in a prescribed pattern across said first and second terminals of said first resistive element, the state of at least a certain one of said switch means being changed to produce a step change in the net resistance measured across said first resistive element, which requires that changing the states of individual switch means produce different prescribed step changes in the decibel value of attenuation that are cumulative;
said pattern of control resistors and switch means, and said first resistive element together comprising in the AC circuit equivalent thereof;
said first resistive element;
first, second, and third control resistors; and
first and second switch means each having at least three electrical contacts;
said first resistor having one terminal thereof directly electrically connected to one terminal of said first resistive element and having the other terminal thereof electrically connected through second resistor and directly electrically connected to first contacts of said first and second switch means, respectively; the other terminal of said first resistive element being directly electrically connected and connected through said third resistor to second contacts of said first and second switch means, respectively; the third contacts of said first and second switch means being directly electrically connected together; the electrical contacts of a particular switch means being electrically short-circuited together when the associated switch means is in the closed state.

25. The pad according to claim 24 wherein changing the states of said first and second switch means in a prescribed manner produces step changes in the decibel value of attenuation that are of substantially the same magnitude.

26. A resistive pad having an attenuation between an input and an output terminal, measured with respect to a reference point, that is variable in discrete steps and having a net resistance between the input and output terminals, comprising:
first and second resistive elements;
first means electrically connecting one of said first and second resistive elements between the input and output terminals and electrically connecting the other of said first and second resistive elements between the reference point and one side of said one resistive element;
a plurality of control resistors;
a plurality of bi-state means; and
second means electrically connecting said control resistors and switch means together in a prescribed pattern across said first and second terminals of said first resistive element, the state of at least a certain one of said switch means being changed to produce a step change in the net resistance measured across said first resistive element, which requires that changing the states of individual switch means produce different prescribed step changes in the decibel value of attenuation that are cumulative;
the AC circuit equivalent of the parallel combination of said first resistive element and said pattern of control resistors and switch means comprising:
said first resistive element;
first, second, and third control resistors; and
first and second switch means each having at least three electrical contacts;
one terminal of said first resistive element being directly electrically connected and connected through said first control resistor to first contacts of said first and second switch means, respectively; the other terminal of said first resistive element being connected through said second control resistor and directly electrically connected to second contacts of said first and second switch means, respectively; the third contacts of said first and second switch means being electrically connected together through said third resistor; the electrical contacts of a particular switch means being electrically short-circuited together when the associated switch means is in the closed state.

27. The pad according to claim 26 wherein changing the states of said first and second switch means in a prescribed manner produces step changes in the decibel value of attenuation of substantially the same magnitude.

28. The pad according to claim 37 wherein each of said first and second switch means comprises a screw switch having at least three electrically conductive switch contacts which are spaced apart around the circumference of an aperture in a substrate and an electrically conductive screw having a head thereof that extends over at least a portion of each of said switch contacts and which short-circuits the latter together when said switch is closed.

29. A resistive pad having an attenuation between an input and an output terminal, measured with respect to a reference ppoint, that is variable in discrete steps and having a net resistance between the input and output terminals, comprising:
first and second resistive elements;
first means electrically connecting one of said first and second resistive elements between the input and output terminals and electrically connecting the other of said first and second resistive elements between the reference point and one side of said one resistive element;
a plurality of control resistors;
a plurality of bi-state switch means; and
second means electrically connecting said control resistors and switch means together in a prescribed pattern across said first and second terminals of said first and resistive element, the state of at least a certain one of said switch means being changed to produce a step change in the net resistance measured across said first resistive element, which requires that changing the states of individual switch means produce different prescribed step changes in the decibel value of attenuation that are cumulative; said pattern of control resistors and switch means and said first resistive element comprising:

said first element;

first, second, and third control resistors;

a first screw switch including at least three electrically conductive switch contacts which are spaced apart around the circumference of an aperture in a dielectric substrate supporting said resistors and resistive elements and including a first electrically conductive screw having a shank threaded into the aperture and having a head which overlaps at least a portion of each of said contacts of said first screw switch; and a second screw switch including at least a pair of electrical contacts spaced apart about the circumference of an aperture in the dielectric substrate supporting said resistors and including a second electrically conductive screw having a shank threaded into the second aperture and an electrically conductive head overlapping at least a portion of the two contacts of said second screw switch;

one terminal of said first resistive element being directly electricallly connected and connected through said first resistor to first contacts of said second and first switches, respectively; the other terminal of said second switch being electrically connected through said second resistor to the second contact of said first switch and to one terminal of said third resistor; the other terminal of said first resistive element being electrically connected to the third terminal of said first switch and to the other terminal of said third resistor; the electrical contacts of a particular screw switch being electrically short-circuited together when the associated screw switch is in the closed state.

30. A resistive pad having an attenuation between an input and an output terminal, measured with respect to a reference point, that is variable in discrete steps and having a net resistance between the input and output terminals, comprising:

first and second resistive elements;

first means electrically connecting one of said first and second resistive elements between the input and output terminals and electrically connecting the other of said first and second resistive elements between the reference point and one side of said one resistive element;

a plurality of control resistors;

a plurality of bi-state means; and second means electrically connecting said control resistors and switch means together in a prescribed pattern across said first and second terminals of said first resistive element, the state of at least a certain one of said switch means being changed to produce a step change in the net resistance measured across said first resistive element, which requires that changing the states of individual switch means produce different prescribed step changes in the decibel value of attenuation that are cumulative; said pattern of control resistors and switch means in combination with said first resistive element comprising in the AC circuit equivalent thereof;

said first resistive element;

first, second, and third control resistors;

first switch means having at least a pair of contacts; and second switch means having at least three electrical contacts;

one end of said first resistive element being directly electrically connected and connected through said first control resistor to first contacts of said first and second switch means, respectively; the other contact of said first switch means being electrically connected through said second resistor to a second contact of said second switch means and to one terminal of the said third resistor; the other terminal of said first resistive element being directly electrically connected to the third contact of said second switch means and to the directly electrically connected to the third contact of said second switch means and to the other terminal of said third resistor; the electrical contacts of a particular switch means being electrically short-circuited together when the associated switch means is in the closed state.

31. The pad according to claim 30 wherein changing the state of said switch means in a prescribed manner produces step changes in the decibel value of the attenuation of substantially the same magnitude.

32. A resistive pad having an attenuation between an input and an output terminal, measured with respect to a reference point, that is variable in discrete steps and having a net resistance between the input and output terminals, comprising:

first and second resistive elements;

first means electrically connecting one of said first and second resistive elements between the input and output terminals and electrically connecting the other of said first and second resistive elements between the reference point and one side of said one resistive element;

a plurality of control resistors;

a plurality of bi-state switch means; and second means electrically connecting said control resistors and switch means together in a prescribed pattern across said first and second terminals of said first resistive element, the state of at least a certain one of said switch means being changed to produce a step change in the net resistance measured across said first resistive element, which requires that changing the states of individual switch means produce different prescribed step changes in the decibel value of attenuation that are cumulative; the AC equivalent circuit of said first resistive element and said pattern comprising:

said first resistive element;

first, second, third, fourth, fifth, and sixth control resistors;

first and second switch means each having at least three electrical contacts; and third switch means having at least four electrical contacts;

one terminal of said first resistive element being electrically connected through said first and second control resistors to one terminals of said first and second switch means, respectively; the one terminal of tsaid first switch means also being connected through said third control resistor to the first contact of said third switch means; the other terminal of said first resistive element being electrically connected through said fourth resistor, through said fifth resistor and directly electrically, connected to the second contacts of said first, second, and third switch means, respectively; the third contacts of said first and third switch means both being connected through said sixth resistor to the third and fourth contacts of said second and third switch means, respectively; the electrical contacts of a particular switch means being electrically short-circuited together when the associated switch means is in the closed state.

33. The pad according to claim 32 wherein changing the states of said switch means in a prescribed manner produces step changes in the decibel value of attenuation of substantially the same magnitude.

34. A resistive pad having an attenuation between an input and an output terminal, measured with respect to a reference point, that is variable in discrete steps and having a net resistance between the input and output terminals, comprising:

first and second resistive elements;
first means electrically connecting one of said first and second resistive elements between the input and output terminals and electrically connecting the other of said first and second resistive elements between the reference point and one side of said one resistive element;
a plurality of control resistors;
a plurality of bi-state switch means; and
second means electrically connecting said control resistors and switch means together in a prescribed pattern across said first and second terminals of said first resistive element, the state of at least a certain one of said switch means being changed to produce a step change in the net resistance measured across said first resistive element, which requires that changing the state of individual switch means produce different prescribed step changes inn the decibel value of attenuation that are cumulative; the AC circuit equivalent of said pattern of control resistors and switch means together with said first resistive element comprising in the Ac equivalent circuit thereof;
said first resistive element;
first, second, third, and fourth resistors; and first and second switch means each having at least three electrical contacts;
one terminals of said first resistive element and said first control resistor being directly electrically connected and connected through said second control resistor to first contacts of said first and second switch means, respectively; the other terminals of said first resistive element and first control resistor being electrically connected through the series combination of said third and fourth control resistors and through said third control resistor to second contacts of said first and second switch means, respectively; the third contacts of said first and second switch means being directly electrically connected together; the electrical contacts of a particular switch means being electrically short-circuited together when the associated switch means is in the closed state.

35. The pad according to claim 34 wherein changing the states of said switch means in a prescribed manner produces step changes in the decibel value of attenuation of substantially the same magnitude.

* * * * *

UNITED STATES PATENT AND TRADEMARK OFFICE
CERTIFICATE OF CORRECTION

PATENT NO. : 4,048,576

DATED : September 13, 1977

INVENTOR(S) : Tom L. Blackburn & Otto G. Wisotzky

It is certified that error appears in the above-identified patent and that said Letters Patent are hereby corrected as shown below:

Column 2, line 59, "52" should read -- 51 --.

Column 3, line 30, before "S2" delete "67"; same line 30, after "screw" insert -- 67 --; line 35, "S6" should read -- S5 --.

Column 5, line 32, after "2 dB" insert -- step --; line 55, after "through" insert -- circuit --.

Column 6, line 7, "D11" should read -- R11 --; line 47, "voltge" should read -- voltage --; line 54, insert a comma after "3B".

Column 7, line 14, "move" should read -- more --; line 60, "employing" should read -- embodying --.

Column 11, line 17, claim 10, "resistive" (first occurrence) should read -- resistance --.

Column 12, line 45, claim 13, "stages" should read -- states --; line 50, claim 14, "swich" should read -- switch --.

Column 13, line 7, claim 15, "stage" should read -- state --; line 64, claim 16, "the" (first occurrence) should read -- in --.

Column 15, line 32, claim 19, "stages" should read -- states --; line 58, claim 20, "aid" should read -- said --.

Column 17, line 17, claim 24, "element" should read -- elements -- same line 17, claim 24, delete the semicolon and insert therefor -- between the reference point and one side of said one resistive element; --.

Column 18, line 4, claim 26, after "bi-state" insert -- switch --; line 41, claim 28, "37" should read -- 27 --; line 52, claim 29, "ppoint" should read -- point --; line 67, claim 29, after "first" the word "and" should be deleted.

Column 19, line 8, claim 29, after "first" insert -- resistive --; line 55, claim 30, after "bi-state" insert -- switch --.

UNITED STATES PATENT AND TRADEMARK OFFICE
CERTIFICATE OF CORRECTION

PATENT NO. : 4,048,576

DATED : September 13, 1977

INVENTOR(S) : Tom L. Blackburn & Otto G. Wisotzky

It is certified that error appears in the above-identified patent and that said Letters Patent are hereby corrected as shown below:

Column 20, line 17, claim 30, after "the" delete -- directly electrically connected to the third contact of said second switch means and to the --; line 25, claim 31, "state" should read -- states --; line 65, claim 32, "tsaid" should read -- said --.

Column 22, line 3, claim 34, "state" should read -- states --; line 4, claim 34, "inn" should read -- in --; line 8, claim 34, "Ac" should read -- AC --; line 11, claim 34, after "and" (second occurrence) start a new paragraph.

Signed and Sealed this

Twenty-seventh Day of December 1977

[SEAL]

Attest:

RUTH C. MASON
*Attesting Officer*

LUTRELLE F. PARKER
*Acting Commissioner of Patents and Trademarks*